United States Patent
Tani

(10) Patent No.: US 10,700,659 B2
(45) Date of Patent: Jun. 30, 2020

(54) MULTIPLEXER, RADIO-FREQUENCY FRONT END CIRCUIT, AND COMMUNICATION TERMINAL

(71) Applicant: Murata Manufacturing Co., Ltd., Kyoto (JP)

(72) Inventor: Masakazu Tani, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/246,822

(22) Filed: Jan. 14, 2019

(65) Prior Publication Data

US 2019/0149121 A1 May 16, 2019

Related U.S. Application Data

(63) Continuation of application No. PCT/JP2017/023482, filed on Jun. 27, 2017.

(30) Foreign Application Priority Data

Jul. 15, 2016 (JP) .................. 2016-139908

(51) Int. Cl.
*H03H 7/46* (2006.01)
*H04B 1/52* (2015.01)
(Continued)

(52) U.S. Cl.
CPC ............. *H03H 7/465* (2013.01); *H03F 3/189* (2013.01); *H03F 3/24* (2013.01); *H03H 7/0115* (2013.01);
(Continued)

(58) Field of Classification Search
CPC ......... H03H 7/465; H03H 7/0115; H04B 1/40
(Continued)

(56) References Cited

U.S. PATENT DOCUMENTS 6,380,823 B1 * 4/2002 Ikata ...................... H03H 9/72
333/133
2009/0201104 A1 8/2009 Ueda et al.
(Continued)

FOREIGN PATENT DOCUMENTS

JP 2009-207116 A 9/2009
JP 2010-021914 A 1/2010
(Continued)

OTHER PUBLICATIONS

Umeda et al., English Translation of JP-2010021914-A (Year: 2010).*

(Continued)

*Primary Examiner* — Ayodeji O Ayotunde
(74) *Attorney, Agent, or Firm* — Pearne & Gordon LLP

(57) ABSTRACT

Even when frequency characteristics are changed in association with multiple communication bands, an attenuation required for a specific frequency band outside a pass band is obtained. A multiplexer includes a transmission filter, a reception filter, and a common connection point. An antenna-side end of the transmission filter and an antenna-side end of the reception filter are connected to the common connection point. The transmission filter includes multiple resonators including a parallel-arm resonator and a variable capacitor that is connected in series with the parallel-arm resonator. An inductor for forming an attenuation pole is provided between the antenna-side end of the reception filter and the common connection point. By the inductor for forming an attenuation pole and the reception filter, which is capacitive, an attenuation pole at a frequency close to or equal to a specific frequency outside the pass band of a transmission signal is formed.

15 Claims, 7 Drawing Sheets

(51) Int. Cl.
  *H03H 9/54* (2006.01)
  *H03F 3/189* (2006.01)
  *H03H 9/70* (2006.01)
  *H03F 3/24* (2006.01)
  *H03H 9/72* (2006.01)
  *H03H 7/01* (2006.01)
  *H03H 7/075* (2006.01)
  *H03H 7/38* (2006.01)
  *H04B 1/40* (2015.01)
  *H03F 3/68* (2006.01)

(52) U.S. Cl.
  CPC .............. *H03H 7/075* (2013.01); *H03H 7/38* (2013.01); *H03H 9/542* (2013.01); *H03H 9/706* (2013.01); *H03H 9/725* (2013.01); *H04B 1/40* (2013.01); *H04B 1/52* (2013.01); *H03F 3/68* (2013.01); *H03F 2200/165* (2013.01); *H03F 2200/171* (2013.01); *H03F 2200/294* (2013.01); *H03F 2200/451* (2013.01)

(58) Field of Classification Search
  USPC ......................................................... 455/73
  See application file for complete search history.

(56) References Cited

U.S. PATENT DOCUMENTS

| | | | |
|---|---|---|---|
| 2011/0199169 A1* | 8/2011 | Kadota | H03H 9/02653 333/195 |
| 2012/0313731 A1 | 12/2012 | Burgener et al. | |
| 2014/0049337 A1 | 2/2014 | Schmidhammer | |
| 2014/0355497 A1 | 12/2014 | Reiha | |
| 2014/0362824 A1* | 12/2014 | Rousu | H04L 5/001 370/331 |
| 2015/0310987 A1 | 10/2015 | Kiwitt et al. | |
| 2016/0301383 A1 | 10/2016 | Tani | |

FOREIGN PATENT DOCUMENTS

| | | | |
|---|---|---|---|
| JP | 2010021914 A | * | 1/2010 |
| JP | 2014-502803 A | | 2/2014 |
| JP | 2014-511626 A | | 5/2014 |
| JP | 2016-504872 A | | 2/2016 |
| WO | 2010/058544 A1 | | 5/2010 |
| WO | 2015/099105 A1 | | 7/2015 |

OTHER PUBLICATIONS

International Search Report for International Application No. PCT/JP2017/023482, dated Aug. 29, 2017.

Written Opinion for International Application No. PCT/JP2017/023482, dated Aug. 29, 2017.

* cited by examiner

MULTIPLEXER, RADIO-FREQUENCY FRONT END CIRCUIT, AND COMMUNICATION TERMINAL

This is a continuation of International Application No. PCT/JP2017/023482 filed on Jun. 27, 2017 which claims priority from Japanese Patent Application No. 2016-139908 filed on Jul. 15, 2016. The contents of these applications are incorporated herein by reference in their entireties.

BACKGROUND OF THE DISCLOSURE

Field of the Disclosure

The present disclosure relates to a multiplexer that includes a frequency-variable filter, and a radio-frequency front end circuit and a communication terminal that include the multiplexer.

Description of the Related Art

Multiplexers include multiple filters having different frequency characteristics such as the frequency of a pass band. Such filters include a ladder-type frequency-variable filter described in Patent Document 1. Frequency-variable filters have variable frequency characteristics and support multiple communication bands.

The frequency-variable filter described in Patent Document 1 has a configuration in which multiple series-arm resonators and multiple parallel-arm resonators are connected in a ladder shape.

A variable capacitor is connected to at least one of the multiple parallel-arm resonators. Varying the capacitance of the variable capacitor varies the frequency of the pass band. The variations in the pass band vary attenuation characteristics.

Patent Document 1: International Publication WO 2015/099105

BRIEF SUMMARY OF THE DISCLOSURE

However, in the case where the ladder-type frequency-variable filter described in Patent Document 1 is implemented by, for example, a circuit substrate in which conductor patterns are formed, not a few floating inductors are connected in series with a parallel-arm resonator, between the parallel-arm resonator and the ground. Furthermore, in order to achieve the desired attenuation characteristics at both ends of the pass band, an inductor may be connected in series with the parallel-arm resonator.

As described above, with the configuration of the ladder filter that includes a series circuit including a parallel-arm resonator and an inductor, an attenuation pole is caused, by sub-resonance of the series circuit including the parallel arm and the inductor, to appear in a harmonic region (a region on a radio-frequency side) of the pass band formed by the ladder filter. Sub-resonance in the present disclosure represents LC series resonance of a capacitive capacitance of a resonator and an inductance of an inductor or LC series resonance of an inductive inductance of a resonator and a capacitance of a capacitor. When a variable impedance element such as a variable capacitor or a variable inductor is connected in series with a series circuit including a parallel-arm resonator and an inductor, the variations in the capacitance of the variable capacitor or the inductance of the variable inductor for varying the frequency of a pass band cause the frequency of sub-resonance to vary. For example, as illustrated in FIG. 2B, which will be described later, the frequency of an attenuation pole by sub-resonance varies. Therefore, as illustrated in FIG. 2B, which will be described later, an attenuation required for a specific frequency band outside the pass band may not be obtained.

Therefore, an object of the present disclosure is to achieve a multiplexer that is able to obtain an attenuation required for a specific frequency band outside the pass band even in the case where the frequency of sub-resonance of a parallel-arm resonator is varied by a variable impedance element.

A multiplexer according to the present disclosure includes a first filter; a second filter; and a common connection point. An antenna-side end of the first filter and an antenna-side end of the second filter are connected to the common connection point. The first filter includes multiple resonators including a first parallel-arm resonator, and a variable capacitor that is connected in series with the first parallel-arm resonator. The second filter includes a resonator having a capacitive component. A first inductor for forming an attenuation pole is provided between the antenna-side end of the second filter and the common connection point.

With this configuration, as a transmission path for a communication signal that passes through the first filter, a circuit configuration in which an LC series resonance circuit including the capacitance of the second filter and the first inductor is connected to the first filter is achieved. Therefore, an attenuation pole at a desired frequency is added to the frequency characteristics of the first filter.

Furthermore, in the multiplexer according to the present disclosure, it is preferable that a frequency of an attenuation pole formed by the first inductor for forming an attenuation pole is close to or equal to a frequency of a harmonic of a communication signal using a pass band of the first filter.

With this configuration, a desired attenuation can be achieved for a harmonic frequency of a communication signal.

Furthermore, in the multiplexer according to the present disclosure, the second filter may include a longitudinally-coupled resonator.

With this configuration, impedance can be reduced by the first inductor. Therefore, even when the impedance of the longitudinally-coupled resonator increases, impedance matching can be achieved easily. Therefore, the electrode width of the longitudinally-coupled resonator filter can be reduced, and the shape of the longitudinally-coupled resonator can be reduced.

Furthermore, in the multiplexer according to the present disclosure, a configuration described below is preferably provided. The first filter includes a series-arm resonator, a first parallel-arm resonator, and a second parallel-arm resonator that is connected to a parallel arm different from the first parallel-arm resonator, the series-arm resonator, the first parallel-arm resonator, and the second parallel-arm resonator being connected in a ladder shape, a variable impedance element having a variable impedance, the variable impedance element being connected in series with the first parallel-arm resonator, and a second fixed inductor having a fixed inductance. No variable impedance element is connected to the second parallel-arm resonator, and the second fixed inductor is connected in series with the second parallel-arm resonator.

With this configuration, by the series circuit including the second parallel-arm resonator and the second inductor, a second attenuation pole at a desired frequency is formed.

Furthermore, a radio-frequency front end circuit according to the present disclosure includes the multiplexer according to any one of the aspects described above; a transmission-side amplification circuit that is connected to the first filter; a reception-side amplification circuit that is connected to the second filter; and an RFIC that is connected to the transmission-side amplification circuit and the reception-side amplification circuit. Alternatively, the present disclosure includes the multiplexer according to any one of the aspects described above; a transmission-side amplification circuit that is connected to the second filter; a reception-side amplification circuit that is connected to the first filter; and an RFIC that is connected to the transmission-side amplification circuit and the reception-side amplification circuit.

With this configuration, a radio-frequency front end circuit having excellent characteristics not only in the pass band of the transmission filter or the reception filter but also outside the pass band can be achieved.

Furthermore, a communication terminal according to the present disclosure includes the radio-frequency front end circuit; and a baseband IC that is connected to the RFIC.

With this configuration, a communication terminal having excellent characteristics not only in the pass band of the transmission filter or the reception filter but also outside the pass band can be achieved.

According to the present disclosure, a ladder-type frequency-variable filter configuring a part of a multiplexer can obtain an attenuation required for a specific frequency band outside the pass band even in the case where the frequency of sub-resonance of a parallel-arm resonator is varied by a variable impedance element.

DETAILED DESCRIPTION OF THE DISCLOSURE

Figure 1:
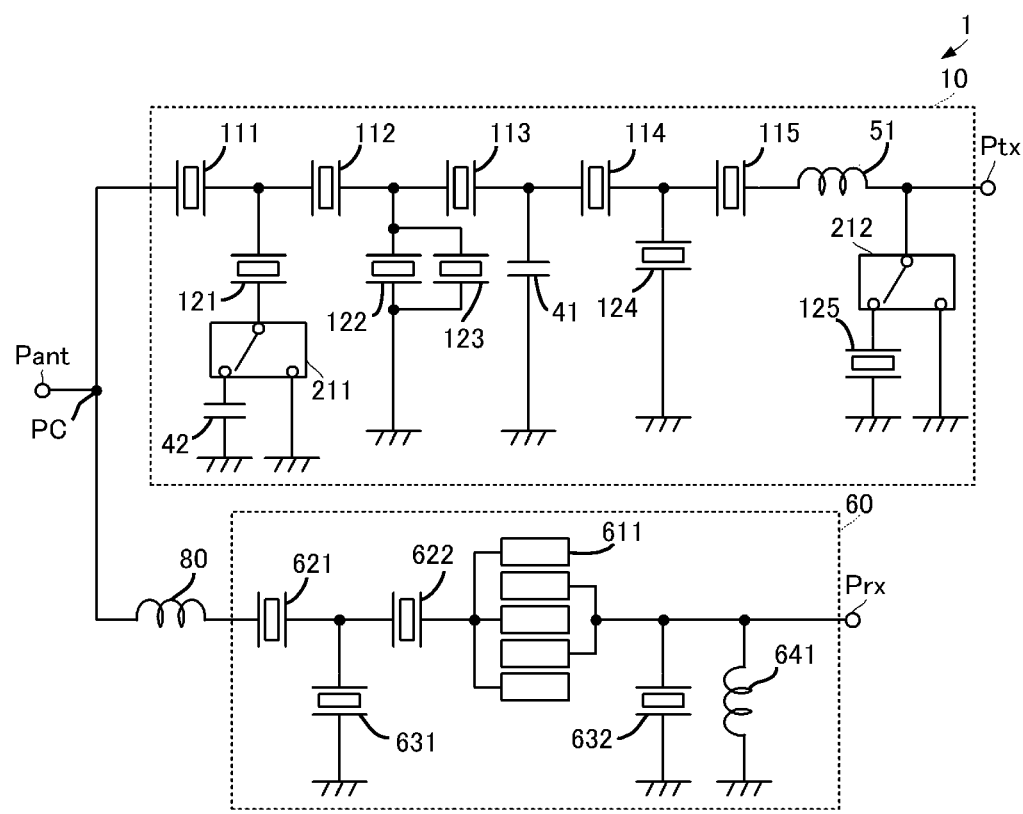
FIG. 1 is a circuit diagram of a multiplexer according to a first embodiment of the present disclosure.

A multiplexer according to a first embodiment of the present disclosure will be explained with reference to the drawings. FIG. 1 is a circuit diagram of the multiplexer according to the first embodiment of the present disclosure.

As illustrated in FIG. 1, a multiplexer 1 includes a transmission filter 10, a reception filter 60, and an inductor 80 for forming an attenuation pole. In this embodiment, the transmission filter 10 corresponds to a "first filter" according to the present disclosure, and the reception filter 60 corresponds to a "second filter" according to the present disclosure. The multiplexer 1 includes a transmission terminal Ptx, a reception terminal Prx, and an antenna terminal Pant.

The transmission filter 10 is connected between the transmission terminal Ptx and the antenna terminal Pant. The reception filter 60 is connected between the reception terminal Prx and the antenna terminal Pant. An antenna-side end of the transmission filter 10 and an antenna-side end of the reception filter 60 are connected to a common connection point PC, and the common connection point PC is connected to the antenna terminal Pant.

The inductor 80 is connected between the common connection point PC and the reception filter 60. The inductance of the inductor 80 is fixed. The inductor 80 corresponds to a "first inductor" according to the present disclosure.

With this configuration, a series circuit including the inductor 80 and the reception filter 60 is connected to a transmission path that connects the transmission terminal Ptx to the antenna terminal Pant, that is, a transmission path through which the transmission filter 10 is arranged.

Each of the transmission filter 10 and the reception filter 60 includes multiple resonators. A specific circuit configuration of each of the transmission filter 10 and the reception filter 60 will be described later. The transmission filter 10 and the reception filter 60 may be set to have capacitive characteristics, by connection of multiple resonators or the like. Capacitive characteristics represent a state looking like capacitance in terms of radio-frequency signals, when viewed from the outside.

Accordingly, the series resonance circuit including the inductor 80 and the capacitive reception filter 60, that is, an LC series resonance circuit, is connected to the transmission line through which the transmission filter 10 is arranged. By providing the LC series resonance circuit, an attenuation pole by the LC series resonance circuit is added to filter characteristics of the transmission line through which the transmission filter 10 is arranged. By appropriately setting the inductance of the inductor 80 and the capacitance of the reception filter 60, the frequency of the attenuation pole is adjusted in an appropriate manner. Therefore, by setting the frequency of the attenuation pole to be close to or equal to a specific frequency outside the pass band of the filter characteristics of the transmission filter 10, an attenuation for the specific frequency increases.

That is, the characteristics outside the pass band of the first filter connected to the antenna terminal Pant with the common connection point PC interposed therebetween are improved by the attenuation pole of the LC series resonance circuit including the second filter connected to the common connection point PC and the inductor 80 having a fixed inductance connected between the common connection point PC and the second filter. Furthermore, the second filter may be a frequency-variable filter.

Figure 2A:
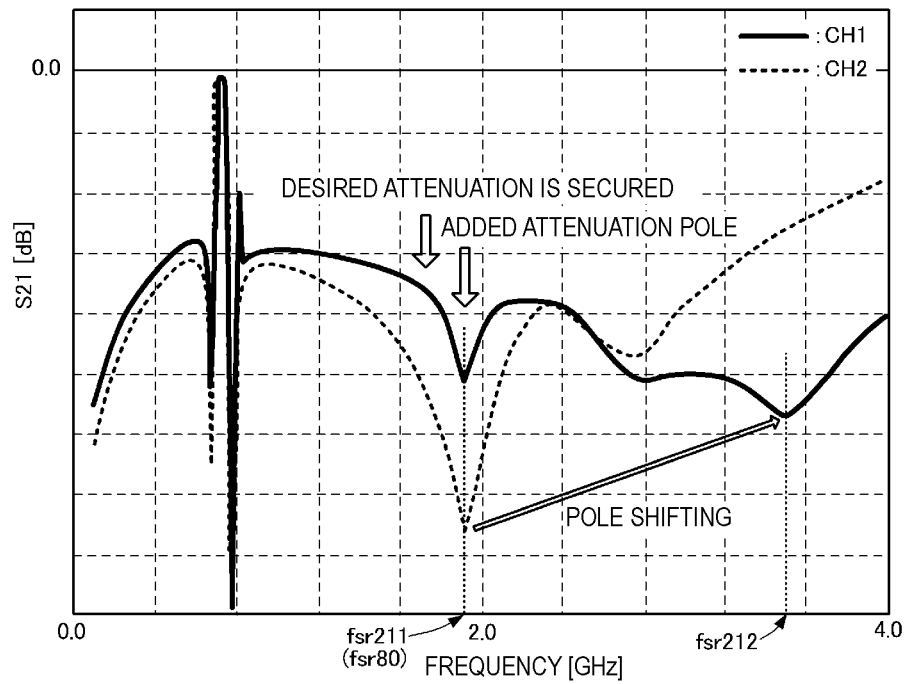
FIG. 2A is a filter characteristic diagram of a transmission filter of the multiplexer according to the first embodiment of the present disclosure.
Figure 2B:
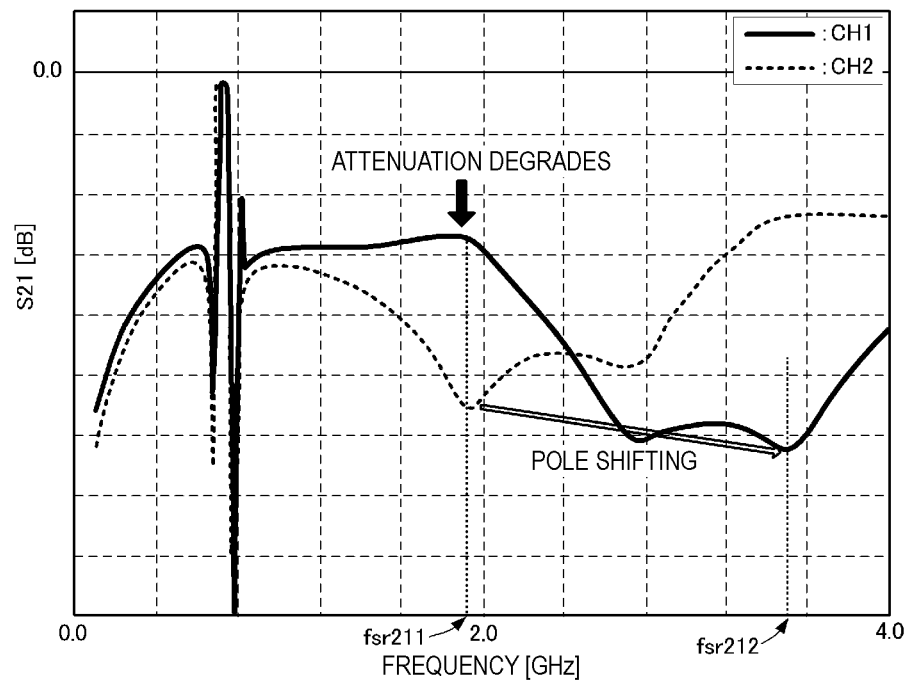
FIG. 2B is a filter characteristic diagram of a transmission filter of a multiplexer as a comparison target.

FIG. 2A is a filter characteristic diagram of the transmission filter of the multiplexer according to the first embodiment of the present disclosure. FIG. 2B is a filter characteristic diagram of a transmission filter of a multiplexer as a comparison target. FIGS. 2A and 2B illustrate the bandpass characteristics of the transmission path from the transmission terminal Ptx to the antenna terminal Pant. In FIGS. 2A and 2B, the solid lines represent the filter characteristics of a communication band CH1, and the broken lines represent the filter characteristics of a communication band CH2. The transmission filter of the multiplexer having the filter characteristics illustrated in FIG. 2B has a known circuit configuration in which the inductor 80 is removed from the multiplexer 1 according to this embodiment.

As illustrated in FIG. 2B, regarding the characteristics of a part between the transmission terminal Ptx and the antenna terminal Pant of the multiplexer as the comparison target, when the capacitance of the transmission filter is changed to switch between communication bands, the pass band is shifted from a use frequency band of the communication band CH2 to a use frequency band of the communication band CH1. The transmission filter 10 includes multiple resonators, and as described in the above problem, a sub-resonance point is generated by an inductor or a parasitic inductor connected to a resonator that is connected in series with a variable capacitor. Therefore, by switching between the communication bands, the sub-resonance point changes depending on whether the setting is for the communication band CH2 or for the communication band CH1. When the setting is switched from the setting for the communication band CH2 to the setting for the communication band CH1, the attenuation pole frequency changes from an attenuation pole frequency fsr211 to an attenuation pole frequency fsr212. In the case of the attenuation pole frequency fsr212, an attenuation at a frequency corresponding to the attenuation pole frequency fsr211 degrades.

As illustrated in FIG. 2A, regrading the characteristics of a part between the transmission terminal Ptx and the antenna terminal Pant of the multiplexer 1 according to an embodiment of this application, when setting is switched from the setting for the communication band CH2 to the setting for the communication band CH1, the attenuation pole frequency changes from the attenuation pole frequency fsr211 to the attenuation pole frequency fsr212. However, the multiplexer 1 includes the LC series resonance circuit including the reception filter 60 and the inductor 80. Therefore, the characteristics of the part between the transmission terminal Ptx and the antenna terminal Pant of the multiplexer 1 have an attenuation pole frequency fsr80 by the LC series resonance circuit. The attenuation pole frequency fsr80 is set to substantially the same as the attenuation pole frequency fsr211. Being substantially the same as a target represents being equal to or close to the target.

Accordingly, in the multiplexer 1, an attenuation for a specific frequency outside the pass band for the transmission path that connects the transmission terminal Ptx to the antenna terminal Pant is always ensured. That is, in the case where the transmission filter 10 performs the filter processing for the transmission signals (communication signals) of the multiple communication bands, an attenuation at a specific frequency can be ensured for any communication band.

For example, in the case where the communication band CH1 is a communication band 28B and the communication band CH2 is a communication band 28A, the use frequency band of the communication band 28A and the use frequency band of the communication band 28B are close to each other. That is, in the transmission filter 10, the pass band for the communication band 28A and the pass band for the communication band 28B are close to each other. In this case, a frequency of 2-times harmonics of the communication band 28A and a frequency of 2-times harmonics of the communication band 28B are also close to each other.

In the multiplexer 1 and the (known) multiplexer as the comparison target, at the setting for the communication band 28A, the attenuation pole frequency fsr211 is close to or equal to the frequencies of 2-times harmonics of the communication band 28A and the communication band 28B.

In this case, when setting is switched to the setting for the communication band 28B, in the case of the multiplexer as the comparison target, the frequency is shifted to the attenuation pole frequency fsr212, an attenuation at the frequency of 2-times harmonics degrades, and an attenuation effect of the 2-times harmonics decreases. However, the transmission filter 10 according to this embodiment has an attenuation pole frequency fsr31, which is fixed, and therefore, an attenuation sufficient for 2-times harmonics can be ensured for both the communication band 28A and the communication band 28B.

In the explanation provided above, the case where there are multiple communication bands 28A and 28B has been explained. However, a configuration of the present disclosure can also be applied to the multiple communication bands using the frequency bands that are close to each other. Furthermore, a configuration of the present disclosure may be applied to a combination of the multiple communication bands in which the frequencies of 2-times harmonics and the frequencies of 3-times harmonics are close to or equal to each other.

Next, a specific configuration of the transmission filter 10 will be explained. As illustrated in FIG. 1, the transmission filter 10 includes multiple resonators. The multiple resonators include multiple series-arm resonators 111, 112, 113, 114, and 115 and multiple parallel-arm resonators 121, 122, 123, 124, and 125. The transmission filter 10 includes multiple switch elements 211 and 212, multiple capacitors 41 and 42 having fixed capacitances, and an inductor 51 having a fixed inductance.

The multiple series-arm resonators 111, 112, 113, 114, and 115 and the multiple parallel-arm resonators 121, 122, 123, 124, and 125 are connected in a ladder shape.

The series-arm resonators 111, 112, 113, 114, and 115 are connected in series between the antenna-side end of the transmission filter 10 and the transmission terminal Ptx. The series-arm resonators 111, 112, 113, 114, and 115 are connected in that order from the antenna-side end. The inductor 51 is connected between the series arm resonator 115 and the transmission terminal Ptx.

One end of the parallel-arm resonator 121 is connected to a connection line of the series arm resonator 111 and the series arm resonator 112, and the other end of the parallel arm resonator 121 is connected to a common terminal of the switch element 211. A first selection terminal of the switch element 211 is connected to the ground with the capacitor 42 interposed therebetween, and a second selection terminal of the switch element 211 is connected to the ground. The switch element 211 selectively connects the first selection terminal or the second selection terminal to the common terminal. The switch element 211 and the capacitor 42 form a variable capacitor.

The parallel arm resonator 122 and the parallel-arm resonator 123 are connected in parallel. One end of this parallel circuit is connected to a connection line of the series-arm resonator 112 and the series-arm resonator 113, and the other end of the parallel circuit is connected to the ground.

One end of the capacitor 41 is connected to a connection line of the series-arm resonator 113 and the series-arm resonator 114, and the other end of the capacitor 41 is connected to the ground.

One end of the parallel arm resonator 124 is connected to a connection line of the series-arm resonator 114 and the series-arm resonator 115, and the other end of the parallel-arm resonator 124 is connected to the ground.

A common terminal of the switch element 212 is connected to the inductor 51 and the transmission terminal Ptx. A first selection terminal of the switch element 212 is connected to the ground with the parallel-arm resonator 125 interposed therebetween. A second selection terminal of the switch element 212 is connected to the ground.

The reception filter 60 includes multiple resonators. The multiple resonators include a longitudinally-coupled resonator 611, series-arm resonators 621 and 622, and parallel-arm resonators 631 and 632. The reception filter 60 includes an inductor 641.

The series-arm resonators 621 and 622 and the longitudinally-coupled resonator 611 are connected in series between the antenna-side end of the reception filter 60 and the reception terminal Prx. The series-arm resonators 621 and 622 and the longitudinally-coupled resonator 611 are connected in that order from the antenna-end side.

One end of the parallel-arm resonator 631 is connected to a connection line of the series-arm resonator 621 and the series-arm resonator 622. The other end of the parallel-arm resonator 631 is connected to the ground.

One end of the parallel-arm resonator 632 is connected to a connection line of the longitudinally-coupled resonator 611 and the reception terminal Prx. The other end of the parallel-arm resonator 632 is connected to the ground.

One end of the inductor 641 is connected to a connection line of the longitudinally-coupled resonator 611 and the reception terminal Prx. The other end of the inductor 641 is connected to the ground. In other words, the inductor 641 is connected in parallel with the parallel-arm resonator 632.

As described above, the reception filter 60 may be regarded as a capacitive circuit. Accordingly, the inductor 80 and the reception filter 60 form an LC series resonance circuit.

As described above, in the multiplexer 1, a parasitic inductor may be connected in series with each resonator, for structural reasons. When a parasitic inductor is connected in series with the parallel-arm resonator 121, a sub-resonance point for the parallel-arm resonator 121 is generated. A variable capacitor (a circuit including the switch element 211 and the capacitor 42 that is selectively connected) is connected to the parallel-arm resonator 121, and the frequency of the sub-resonance point is shifted by the capacitance of the variable capacitor. In particular, in a circuit such as a frequency-variable filter configuring the multiplexer 1 in which multiple series-arm resonators and multiple parallel-arm resonators are connected in a ladder shape, the frequency of an attenuation pole by a sub-resonance point is away from the pass band, and the shift range of the frequency of the attenuation pole is also large.

However, as described above, in the multiplexer 1, the inductor 80 and the reception filter 60 form an LC series resonance circuit. In addition, by appropriately setting the element values of the inductor 80 and the reception filter 60, even when the frequency of an attenuation pole by a sub-resonance point by the parallel-arm resonator 121 is away from the pass band, the attenuation pole of the LC series resonance circuit may be set to substantially the same as the frequency of a sub-resonance point before the frequency shift of the parallel-arm resonator 121.

Accordingly, even if switching between the communication bands of the transmission filter 10 is performed, an attenuation in a specific frequency band including the frequency of the attenuation pole can be ensured by the attenuation pole of the LC series resonance circuit including the inductor 80 and the reception filter 60.

Furthermore, the reception filter 60 includes the longitudinally-coupled resonator 611. As described above, in the case where the longitudinally-coupled resonator 611 is provided, the effects described below can also be achieved. To reduce the size of the longitudinally-coupled resonator 611, the electrode width is reduced. A reduction in the electrode width increases the impedance of the reception filter 60.

However, by connecting the inductor 80 to the reception filter 60, a low impedance can be achieved, compared to the case where only the reception filter 60 is provided. Accordingly, the impedance matching on the reception filter 60 side in the frequency band of a reception signal of a communication signal is easily achieved. Therefore, the compact reception filter 60 and multiplexer 1, having less loss with respect to a reception signal, can be achieved.

Figure 3:
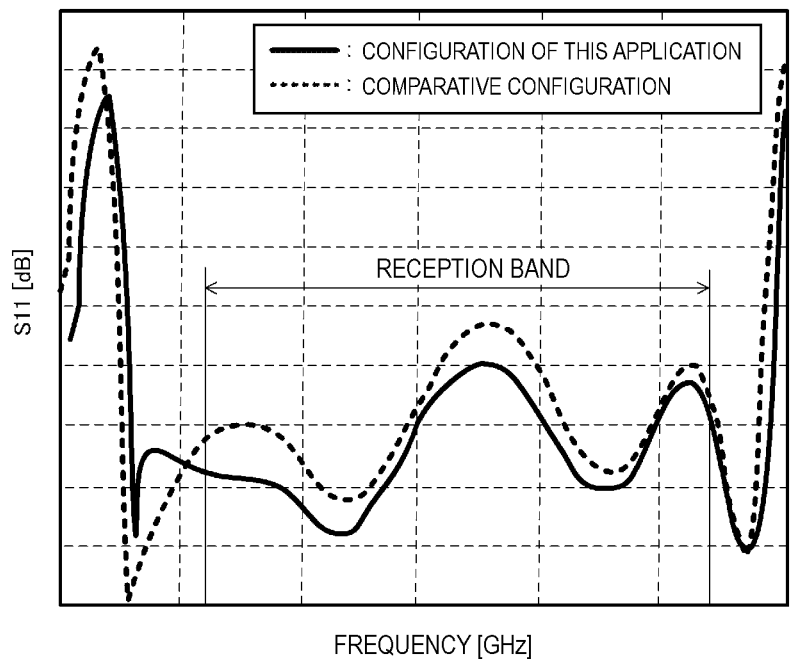
FIG. 3 is a filter characteristic diagram of a reception circuit side of the multiplexer according to the first embodiment of the present disclosure.

FIG. 3 is a filter characteristic diagram of the reception circuit side of the multiplexer according to the first embodiment of the present disclosure. FIG. 3 illustrates the reflection characteristics for the transmission path from the antenna terminal Pant to the reception terminal Prx. A solid line in FIG. 3 represents the characteristics of the multiplexer 1 according to the first embodiment of the present disclosure, and a broken line in FIG. 3 represents the characteristics of the comparative configuration. As illustrated in FIG. 3, with the use of the multiplexer 1, the return loss in the frequency band (reception band) of a reception signal can be reduced, and the loss with respect to the reception signal can thus be reduced.

Figure 4:
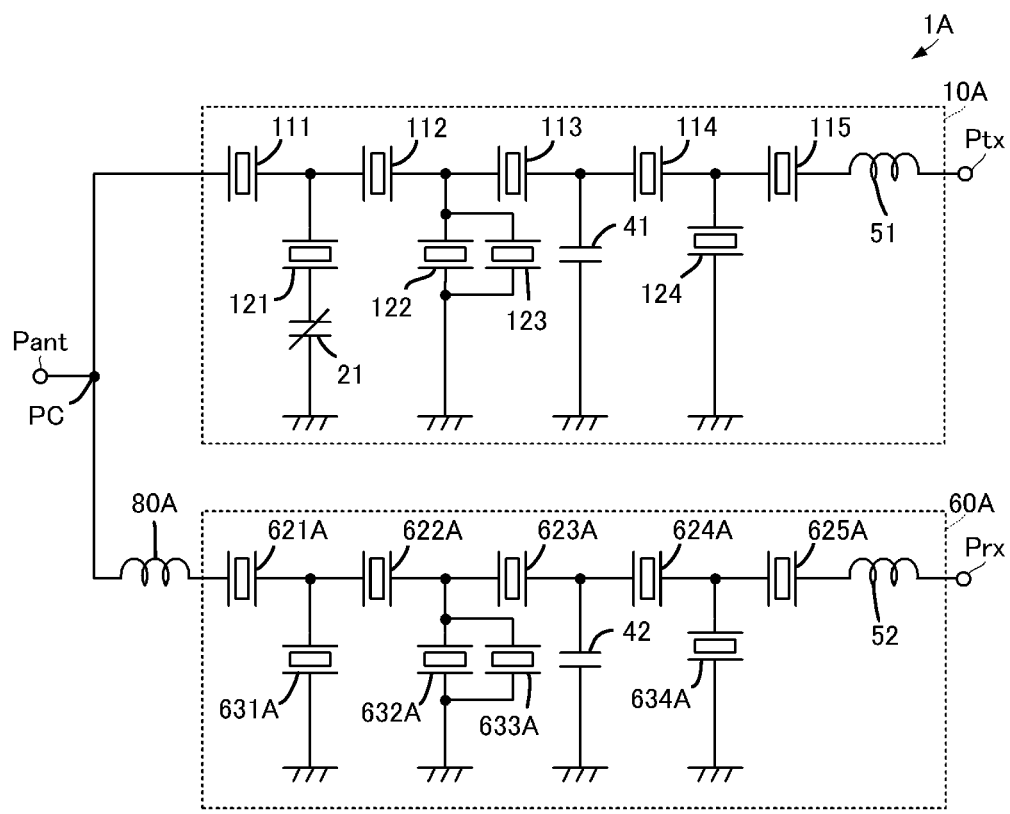
FIG. 4 is a circuit diagram of a multiplexer according to a second embodiment of the present disclosure.

Next, a multiplexer according to a second embodiment of the present disclosure will be explained with reference to the drawings. FIG. 4 is a circuit of the multiplexer according to the second embodiment of the present disclosure.

A multiplexer 1A according to this embodiment is different from the multiplexer 1 according to the first embodiment in the circuit configuration of a transmission filter 10A and the reception filter 60. The basic configuration regarding how the transmission filter 10A, a reception filter 60A, and an inductor 80A are connected to a common connection point PC, or the like is similar to that described above, and the explanation for the similar configuration features will be omitted.

As illustrated in FIG. 4, the multiplexer 1A includes the transmission filter 10A, the reception filter 60A, and the inductor 80A. The inductance of the inductor 80A is set in accordance with a concept similar to that for the inductor 80. In this embodiment, the transmission filter 10A corresponds to the "first filter" according to the present disclosure, and the reception filter 60A corresponds to the "second filter" according to the present disclosure. Furthermore, the inductor 80A corresponds to the "first inductor" according to the present disclosure.

The transmission filter 10A has a configuration in which the multiple switch elements 211 and 212, the capacitor 42, and the parallel-arm resonator 125 are removed from the transmission filter 10 and a variable capacitor 21 is added to the transmission filter 10. One end of the variable capacitor 21 is connected to the parallel-arm resonator 121, and the other end of the variable capacitor 21 is connected to the ground.

The reception filter 60A includes multiple resonators. The multiple resonators include multiple series-arm resonators 621A, 622A, 623A, 624A, and 625A and multiple parallel-arm resonators 631A, 632A, 633A, and 634A. The reception filter 60A includes the capacitor 42 and an inductor 52. The circuit configuration of the reception filter 60A is similar to that of the transmission filter 10A with the exception that the reception filter 60A does not include the variable capacitor 21.

The multiple series-arm resonators 621A, 622A, 623A, 624A, and 625A and the multiple parallel-arm resonators 631A, 632A, 633A, and 634A are connected in a ladder shape.

The series-arm resonators 621A, 622A, 623A, 624A, and 625A are connected in series between the antenna-side end of the reception filter 60A and the reception terminal Prx. The series-arm resonators 621A, 622A, 623A, 624A, and 625A are connected in that order from the antenna-side end. The inductor 52 is connected between the series-arm resonator 625A and the reception terminal Prx.

One end of the parallel-arm resonator 631A is connected a connection line of the series-arm resonator 621A and the series-arm resonator 622A, and the other end of the parallel-arm resonator 631A is connected to the ground.

The parallel-arm resonator 632A and the parallel-arm resonator 633A are connected in parallel. One end of this parallel circuit is connected to a connection line of the series-arm resonator 622A and the series-arm resonator 623A, and the other end of the parallel circuit is connected to the ground.

One end of the capacitor 42 is connected to a connection line of the series arm resonator 623A and the series arm resonator 624A, and the other end of the capacitor 41 is connected to the ground.

One end of the parallel-arm resonator 634A is connected to a connection line of the series-arm resonator 624A and the series-arm resonator 625A, and the other end of the parallel-arm resonator 634A is connected to the ground.

Also with the multiplexer 1A having the above configuration, an attenuation at a specific frequency outside the pass band of a transmission signal can be ensured, as with the multiplexer 1 according to the first embodiment.

Figure 5:
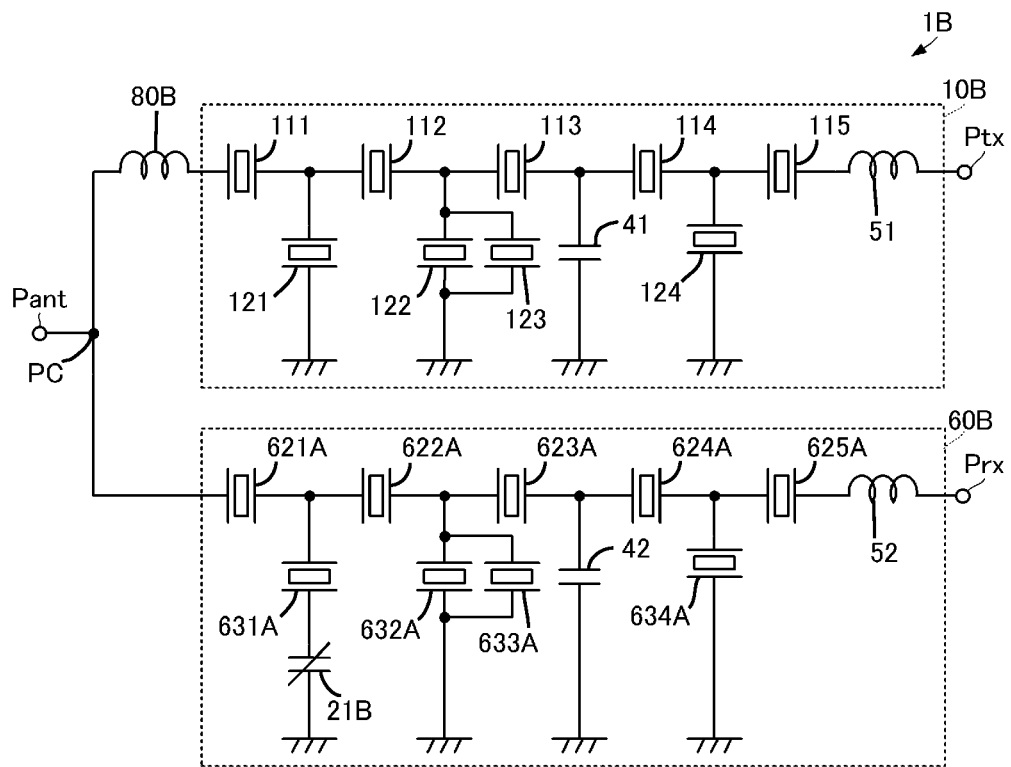
FIG. 5 is a circuit diagram of a multiplexer according to a third embodiment of the present disclosure.

Next, a multiplexer according to a third embodiment of the present disclosure will be explained with reference to the drawings. FIG. 5 is a circuit diagram of the multiplexer according to the third embodiment of the present disclosure.

As illustrated in FIG. 5, a multiplexer 1B according to this embodiment is different from the multiplexer 1A according to the second embodiment in positions where a variable capacitor 21B and an inductor 80B are connected. The other configuration features of the multiplexer 1B are similar to those of the multiplexer 1A, and the explanation for those similar configuration features will be omitted.

The multiplexer 1B includes a transmission filter 10B, a reception filter 60B, and the inductor 80B. The transmission filter 10B has a configuration in which the variable capacitor 21 is removed from the transmission filter 10A. The reception filter 60B has a configuration in which the variable capacitor 21B is added to the reception filter 60A. In this embodiment, the transmission filter 10B corresponds to the "second filter" according to the present disclosure, and the reception filter 60B corresponds to the "first filter" according to the present disclosure.

One end of the variable capacitor 21B is connected to the parallel-arm resonator 631A of the reception filter 60B, and the other end of the variable capacitor 21B is connected to the ground.

The inductor 80B has an inductance different from that of the inductor 80A. The inductor 80B is connected between the transmission filter 10B and the common connection point PC. With this configuration, the inductor 80B and the transmission filter 10B, which is capacitive, form an LC series resonance circuit. Therefore, a configuration in which the LC series resonance circuit including the inductor 80B and the capacitive transmission filter 10B is connected to the reception filter 60B is obtained.

Here, by appropriately setting the element values of the inductor 80B and the capacitive transmission filter 10B, a frequency of an attenuation pole by the LC series resonance circuit including the inductor 80B and the capacitive transmission filter 10B is set to be close to or equal to the frequency of an attenuation pole outside the pass band by a sub-resonance point of the parallel-arm resonator that is connected in series with the variable capacitor included in the reception filter 60B. Accordingly, an attenuation at a specific frequency outside the pass band of a reception signal can be ensured.

Figure 6:
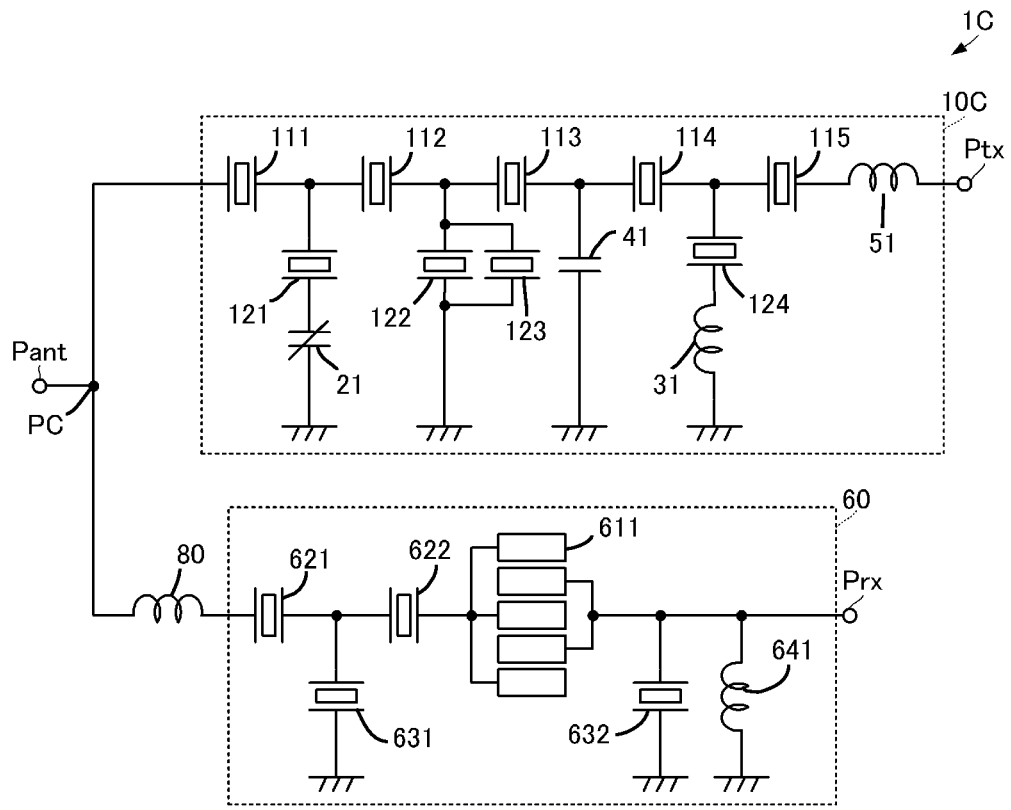
FIG. 6 is a circuit diagram of a multiplexer according to a fourth embodiment of the present disclosure.

Next, a multiplexer according to a fourth embodiment of the present disclosure will be explained with reference to the drawings. FIG. 6 is a circuit diagram of the multiplexer according to the fourth embodiment of the present disclosure.

As illustrated in FIG. 6, a multiplexer 1C according to this embodiment is different from the multiplexer 1A according to the second embodiment in the configuration of a transmission filter 10C. The other configuration features of the multiplexer 1C are similar to those of the multiplexer 1A, and the explanation for those similar configuration features will be omitted.

The multiplexer 1C includes the transmission filter 10C, the reception filter 60, and the inductor 80. The transmission filter 10C has a configuration in which an inductor 31 is added to the transmission filter 10A. One end of the inductor 31 is connected to the parallel-arm resonator 124, and the other end of the inductor 31 is connected to the ground. In this embodiment, the transmission filter 10C corresponds to the "first filter" according to the present disclosure, and the reception filter 60 corresponds to the "second filter" according to the present disclosure. The inductor 31 corresponds to the "second inductor" according to the present disclosure.

By connecting the parallel-arm resonator 124 and the inductor 31, which has a fixed inductance, in series, a sub-resonance point having a fixed frequency is generated for the parallel-arm resonator 124. Accordingly, the filter characteristics of the transmission filter 10C have an attenuation pole at the frequency of the sub-resonance point. Therefore, by setting the attenuation pole to be close to or equal to a specific frequency, an attenuation at the specific frequency can be ensured. That is, with an attenuation effect by the inductor 80 and an attenuation effect by the inductor 31, a more reliable and larger attenuation can be achieved. Furthermore, by setting the frequency of the attenuation pole by the inductor 80 to be different from the frequency of the attenuation pole by the inductor 31, the attenuations at two specific frequencies can be ensured.

For example, in the transmission (703 to 748 MHz) filter of the communication band 28, the attenuation of harmonics of 2-times waves (1406 to 1496 MHz) and 3-times waves (2109 to 2244 MHz) is also important. By allocating both an attenuation effect by the inductor 80 and an attenuation effect by the inductor 31 to the frequency close to the 2-times waves, a large attenuation can be ensured near the 2-times waves. Furthermore, by allocating the attenuation effect by the inductor 80 to a frequency close to the 2-times waves and allocating the attenuation effect by the inductor 31 to a frequency close to the 3-times waves, the attenuations in two frequency bands close to the 2-times waves and the 3-times waves can be ensured.

Figure 7:
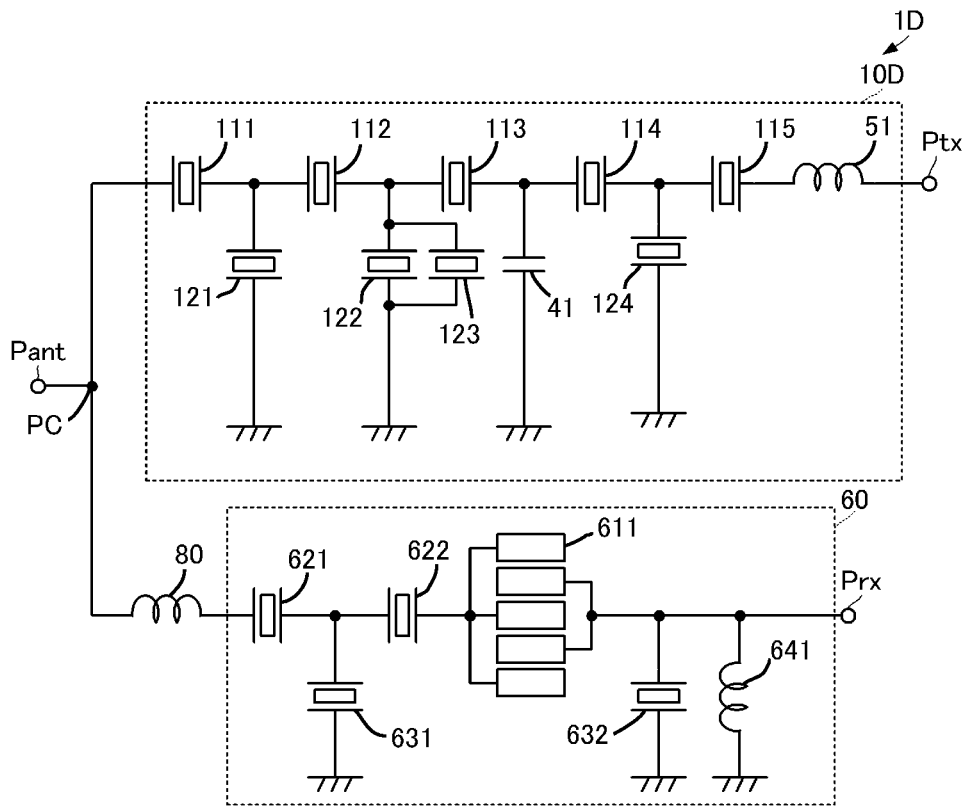
FIG. 7 is a circuit diagram of a multiplexer according to a fifth embodiment of the present disclosure.

Next, a multiplexer according to a fifth embodiment of the present disclosure will be explained with reference to the drawings. FIG. 7 is a circuit diagram of the multiplexer according to the fifth embodiment of the present disclosure.

As illustrated in FIG. 7, a multiplexer 1D according to this embodiment is different from the multiplexer 1 according to the first embodiment in that the parallel-arm resonator 125, the multiple switch elements 211 and 212, and the capacitor 42 are removed. The other configuration features of the multiplexer 1D are similar to those of the multiplexer 1, and the explanation for those similar configuration features will be omitted.

The multiplexer 1D includes a transmission filter 10D, the reception filter 60, and the inductor 80. In this embodiment, the transmission filter 10D corresponds to the "first filter" according to the present disclosure, and the reception filter 60 corresponds to the "second filter" according to the present disclosure.

The transmission filter 10D includes multiple resonators. The multiple resonators include the multiple series-arm resonators 111, 112, 113, 114, and 115 and the multiple parallel-arm resonators 121, 122, 123, and 124. The transmission filter 10D includes the capacitor 41 having a fixed capacitance and the inductor 51 having a fixed inductance.

The multiple series-arm resonators 111, 112, 113, 114, and 115 and the multiple parallel-arm resonators 121, 122, 123, and 124 are connected in a ladder shape.

One end of the parallel-arm resonator 121 is connected to a connection line of the series-arm resonator 111 and the series-arm resonator 112, and the other end of the parallel-arm resonator 121 is connected to the ground.

The parallel-arm resonator 122 and the parallel-arm resonator 123 are connected in parallel. One end of this parallel circuit is connected to a connection line of the series-arm resonator 112 and the series-arm resonator 113, and the other end of the parallel circuit is connected to the ground.

One end of the capacitor 41 is connected to a connection line of the series-arm resonator 113 and the series-arm resonator 114, and the other end of the capacitor 41 is connected to the ground.

One end of the parallel-arm resonator 124 is connected to a connection line of the series-arm resonator 114 and the series-arm resonator 115, and the other end of the parallel-arm resonator 124 is connected to the ground.

As described above, the filter characteristics of the transmission filter 10D are fixed, not variable. Also with the transmission filter 10D having the above configuration, in the case where a desired attenuation is required at a specific frequency outside the pass band, an attenuation pole of the LC series resonance circuit including the inductor 80 and the capacitive reception filter 60 can be used.

Figure 8:
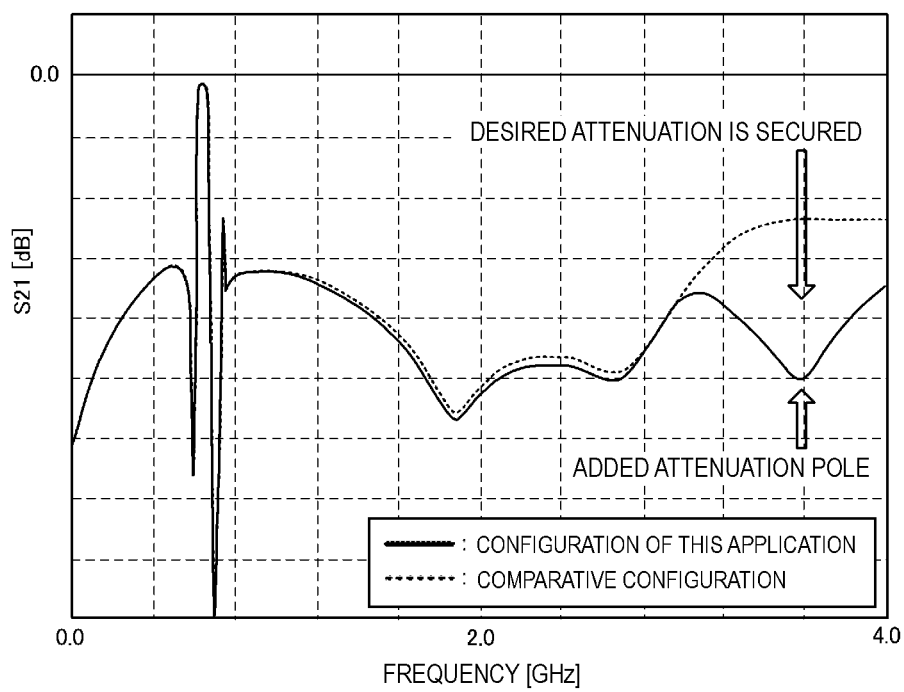
FIG. 8 is a diagram illustrating the filter characteristics of the multiplexer according to the fifth embodiment of the present disclosure and a multiplexer having a comparative configuration.

FIG. 8 is a diagram illustrating the filter characteristics of the multiplexer according to the fifth embodiment of the present disclosure and a multiplexer having a comparative configuration. The filter characteristics illustrated in FIG. 8 represent the bandpass characteristics of a transmission path from the transmission terminal Ptx to the antenna terminal Pant. A solid line illustrated in FIG. 8 represents the filter characteristics of a configuration of this application (multiplexer 1D), and a broken line illustrated in FIG. 8 represents the filter characteristics of the comparative configuration. In the comparative configuration, the inductor 80 is removed from the configuration of the multiplexer 1D.

With the configuration of the multiplexer 1D according to this embodiment, an added attenuation pole illustrated in FIG. 8 can be formed. Therefore, by setting the added attenuation pole to be close to or equal to a specific frequency outside the pass band, an attenuation at the specific frequency can be ensured, as illustrated in FIG. 8.

Figure 9:
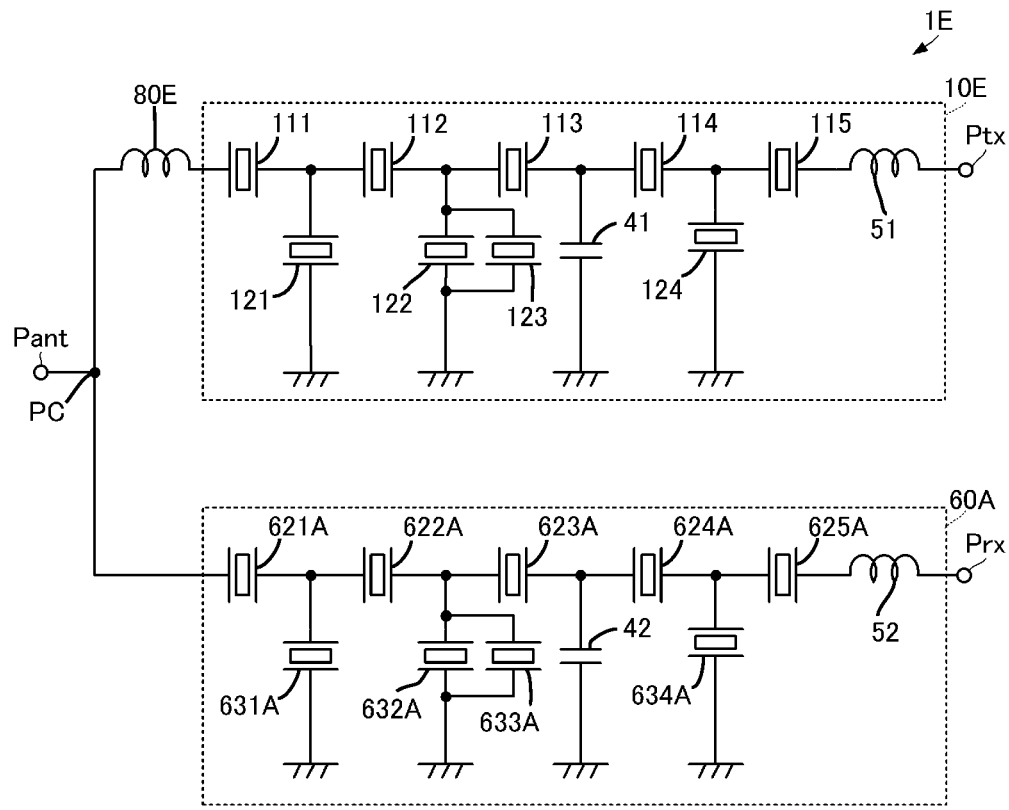
FIG. 9 is a circuit diagram of a multiplexer according to a sixth embodiment of the present disclosure.

Next, a multiplexer according to a sixth embodiment of the present disclosure will be explained with reference to the drawings. FIG. 9 is a circuit diagram of the multiplexer according to the sixth embodiment of the present disclosure.

As illustrated in FIG. 9, a multiplexer 1E according to this embodiment is different from the multiplexer 1A according to the second embodiment in that the variable capacitor 21 is removed and an inductor 80E is arranged at a different position. The other configuration features of the multiplexer 1E are similar to those of the multiplexer 1A, and the explanation for those similar configuration features will be omitted.

The multiplexer 1E includes a transmission filter 10E, the reception filter 60A, and the inductor 80E. In this embodiment, the transmission filter 10E corresponds to the "second filter" according to the present disclosure, and the reception filter 60A corresponds to the "first filter" according to the present disclosure. The transmission filter 10E has a configuration in which the variable capacitor 21 is removed from the transmission filter 10A.

The inductor 80E is connected between the transmission filter 10E and the common connection point PC.

As described above, the filter characteristics of the reception filter 60A are fixed, not variable. Also with the reception filter 60A having the above configuration, in the case where a desired attenuation is required at a specific frequency outside the pass band, an attenuation pole of the LC series resonance circuit including the inductor 80E and the capacitive transmission filter 10E can be used.

Figure 10:
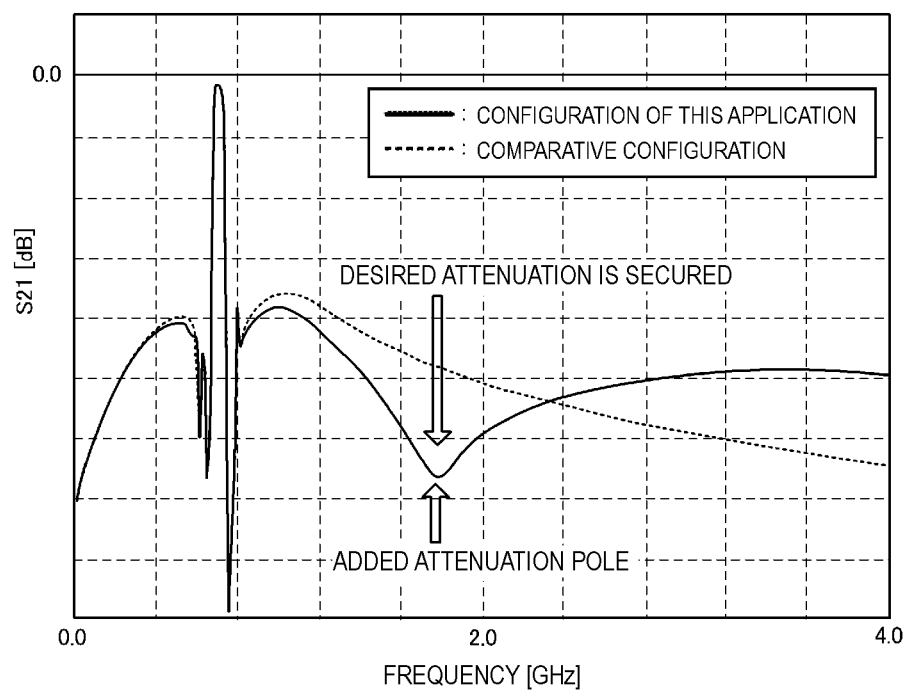
FIG. 10 is a diagram illustrating the filter characteristics of the multiplexer according to the sixth embodiment of the present disclosure and a multiplexer having a comparative configuration.

FIG. 10 is a diagram illustrating the filter characteristics of the multiplexer according to the sixth embodiment of the present disclosure and a multiplexer having a comparative configuration. The filter characteristics illustrated in FIG. 10 represent the bandpass characteristics of a transmission path from the antenna terminal Pant to the reception terminal Prx. A solid line illustrated in FIG. 10 represents the filter characteristics of a configuration of this application (multiplexer 1E), and a broken line illustrated in FIG. 10 represents the filter characteristics of the comparative configuration. In the comparative configuration, the inductor 80E is removed from the configuration of the multiplexer 1E.

With the configuration of the multiplexer 1E according to this embodiment, an added attenuation pole illustrated in FIG. 10 can be formed. Therefore, by setting the added attenuation pole to be close to or equal to a specific frequency outside the pass band, an attenuation at the specific frequency can be ensured, as illustrated in FIG. 10.

Figure 11:
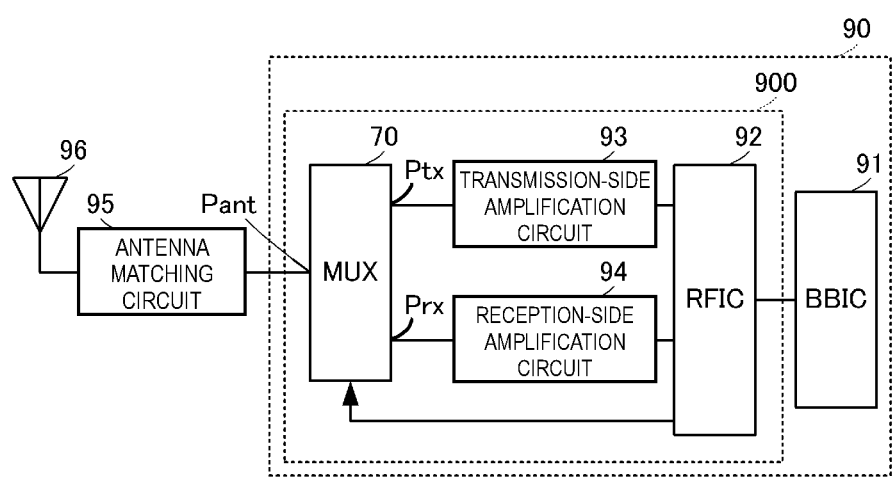
FIG. 11 is a functional block diagram of a communication terminal according to a seventh embodiment of the present disclosure.

Next, a communication terminal according to a seventh embodiment of the present disclosure will be explained with reference to the drawings. FIG. 11 is a functional block diagram of the communication terminal according to the seventh embodiment of the present disclosure.

A communication terminal 900 includes the multiplexer 70, a BBIC 91, an RFIC 92, a transmission-side amplification circuit 93, a reception-side amplification circuit 94, an antenna matching circuit 95, and an antenna 96. The antenna terminal Pant of the multiplexer 70 is connected to the antenna 96 with the antenna matching circuit 95 interposed therebetween. The transmission terminal Ptx of the multiplexer 70 is connected to the transmission-side amplification circuit 93. The reception terminal Prx of the multiplexer 70 is connected to the reception-side amplification circuit 94. The transmission-side amplification circuit 93 and the reception-side amplification circuit 94 are connected to the RFIC 92. The RFIC 92 is connected to the BBIC 91. The multiplexer 70 is one of the multiplexers 1, 1A, 1B, 1C, 1D, and 1E according to the embodiments described above.

The BBIC 91 performs various types of processing at a baseband frequency. The RFIC 92 performs the radio-frequency processing regarding wireless communication. As a specific example, the RFIC 92 performs the generation of a transmission signal, the demodulation of a reception signal, and the like. Furthermore, the RFIC 92 demodulates the communication band information from a reception signal. A control signal for controlling variable impedance is outputted from the BBIC 91 or the RFIC 92.

A transmission signal outputted from the RFIC 92 is amplified by the transmission-side amplification circuit 93. The transmission-side amplification circuit 93 includes a PA and the like and amplifies a transmission signal. The amplified transmission signal is inputted to the transmission terminal Ptx of the multiplexer 70. The transmission signal is subjected to filter processing at the transmission filter 10, which is a transmission filter, and is output through the antenna terminal Pant. The transmission signal is transmitted to the antenna 96 via the antenna matching circuit 95, and is transmitted to the outside through the antenna 96.

The reception signal received at the antenna 96 is inputted to the antenna matching circuit 95 and the antenna terminal Pant of the multiplexer 70. The reception filter of the multiplexer 70 performs filter processing on the reception signal, and outputs the processed reception signal through the reception terminal Prx. The reception signal is inputted to the reception-side amplification circuit 94. The reception-side amplification circuit 94 includes an LNA and the like. The reception-side amplification circuit 94 amplifies the reception signal and outputs the amplified reception signal to the RFIC 92.

The communication terminal 90 includes the multiplexer 70 having a circuit configuration described in each of the embodiments described above. Thus, an attenuation at a common specific frequency outside pass bands for the transmission signals or reception signals of the multiple communication bands can be ensured.

Furthermore, the number of series-arm resonators and parallel-arm resonators in a multiplexer according to each of the embodiments described above may be set such that a circuit of a ladder shape can be formed.

Furthermore, a mode in which the multiplexer according to each of the embodiments described above is a duplexer has been described. However, a triplexer or the like may be used as a multiplexer. Furthermore, a multiplexer may solely include multiple transmission filters or solely include multiple reception filters. A multiplexer may include a transmission filter and a reception filter combined in an appropriate manner.

Furthermore, in each of the embodiments described above, a mode in which a variable capacitor is used has been described. However, variable impedance elements such as a variable inductor or the like may be used.

1, 1A, 1B, 1C, 1D, and 1E: multiplexer, 10, 10A, 10B, 10C, 10D, and 10E: transmission filter, 21 and 21B: variable capacitor, 31: inductor, 41 and 42: capacitor, 51 and 52: inductor, 60, 60A, and 60B: reception filter, 70: multiplexer, 80, 80A, 80B, and 80E: inductor, 90: communication terminal, 91: BBIC, 92: RFIC, 93: transmission-side amplification circuit, 94: reception-side amplification circuit, 95: antenna matching circuit, 96: antenna, 111, 112, 113, 114, 115, 621, 621A, 622, 622A, 623A, 624A, and 625A: series-arm resonator, 121, 122, 123, 124, 125, 631, 631A, 632, 632A, 633A, and 634A: parallel arm resonator, 211 and 212: switch element, 611: longitudinally-coupled resonator, 641: inductor, 900: communication terminal, CH1 and CH2: communication band, fsr211, fsr212, fsr31, and fsr80: attenuation pole frequency, Pant: antenna terminal, PC: common connection point, Prx: reception terminal, Ptx: transmission terminal

The invention claimed is:

1. A multiplexer comprising:
a first filter;
a second filter;
a common node to which a first end of the first filter and a first end of the second filter are connected; and
a first inductor,
wherein the first filter comprises:
a plurality of resonators including a first parallel-arm resonator, the first parallel-arm resonator being connected between a signal path through the multiplexer and ground;
a variable capacitor connected in series with the first parallel-arm resonator;
a series-arm resonator and a second parallel-arm resonator, wherein the series-arm resonator, the first parallel-arm resonator, and the second parallel-arm resonator are connected in a ladder configuration;
a variable impedance element having a variable impedance that is connected in series with the first parallel-arm resonator; and
a second inductor having a fixed inductance that is connected in series with the second parallel-arm resonator,
wherein the second filter comprises a resonator having a capacitive characteristic,
wherein the first inductor is connected between the first end of the second filter and the common node, and
wherein no variable impedance element is connected to the second parallel-arm resonator.

2. The multiplexer according to claim 1, wherein a frequency of an attenuation pole formed by the first inductor is substantially equal to a frequency of a harmonic of a communication signal having a frequency in a pass band of the first filter.

3. The multiplexer according to claim 1, wherein the second filter comprises a longitudinally-coupled resonator.

4. The multiplexer according to claim 2, wherein the second filter comprises a longitudinally-coupled resonator.

5. The multiplexer according to claim 1, wherein the second filter comprises a plurality of resonators connected in a ladder configuration.

6. A radio-frequency front end circuit comprising:
the multiplexer according to claim 1;
a transmission-side amplification circuit that is connected to the first filter;
a reception-side amplification circuit that is connected to the second filter; and
a radio-frequency integrated circuit (RFIC) that is connected to the transmission-side amplification circuit and to the reception-side amplification circuit.

7. A communication terminal comprising:
the radio-frequency front end circuit according to claim 6; and
a baseband integrated circuit that is connected to the RFIC.

8. A multiplexer comprising:
a first filter;
a second filter;
a common node to which a first end of the first filter and a first end of the second filter are connected; and
a first inductor, wherein the first filter comprises:
  a plurality of resonators including a first parallel-arm resonator, the first parallel-arm resonator being connected between a signal path through the multiplexer and ground, and
  a variable capacitor connected in series with the first parallel-arm resonator,
wherein the second filter comprises a resonator having a capacitive characteristic,
wherein the first inductor is connected between the first end of the second filter and the common node, and
wherein a frequency of an attenuation pole formed by the first inductor is substantially equal to a frequency of a harmonic of a communication signal having a frequency in a pass band of the first filter.

9. The multiplexer according to claim 8, wherein the second filter comprises a longitudinally-coupled resonator.

10. The multiplexer according to claim 8, wherein the second filter comprises a plurality of resonators connected in a ladder configuration.

11. A radio-frequency front end circuit comprising:
the multiplexer according to claim 8;
a transmission-side amplification circuit that is connected to the first filter;
a reception-side amplification circuit that is connected to the second filter; and
a radio-frequency integrated circuit (RFIC) that is connected to the transmission-side amplification circuit and to the reception-side amplification circuit.

12. A communication terminal comprising:
the radio-frequency front end circuit according to claim 11; and
a baseband integrated circuit that is connected to the RFIC.

13. A multiplexer comprising:
a first filter;
a second filter;
a common node to which a first end of the first filter and a first end of the second filter are connected; and
a first inductor,
wherein the first filter comprises:
  a plurality of resonators including a first parallel-arm resonator, the first parallel-arm resonator being connected between a signal path through the multiplexer and ground, and
  a variable capacitor connected in series with the first parallel-arm resonator,
wherein the second filter comprises a resonator having a capacitive characteristic,
wherein the first inductor is connected between the first end of the second filter and the common node, and
wherein the second filter comprises a longitudinally-coupled resonator.

14. A radio-frequency front end circuit comprising:
the multiplexer according to claim 13;
a transmission-side amplification circuit that is connected to the first filter;
a reception-side amplification circuit that is connected to the second filter; and
a radio-frequency integrated circuit (RFIC) that is connected to the transmission-side amplification circuit and to the reception-side amplification circuit.

15. A communication terminal comprising:
the radio-frequency front end circuit according to claim 14; and
a baseband integrated circuit that is connected to the RFIC.

* * * * *